(12) United States Patent
Moon et al.

(10) Patent No.: US 9,736,956 B2
(45) Date of Patent: Aug. 15, 2017

(54) ELECTRONIC DEVICE HAVING DISPLAY MODULE

(71) Applicant: Samsung Electronics Co., Ltd., Gyeonggi-do (KR)

(72) Inventors: Hee-Cheul Moon, Gyeonggi-do (KR); Sang-Hun Kim, Gyeonggi-do (KR); Yong-Seok Lee, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/196,259

(22) Filed: Mar. 4, 2014

(65) Prior Publication Data

US 2014/0267990 A1    Sep. 18, 2014

(30) Foreign Application Priority Data

Mar. 12, 2013 (KR) .................. 10-2013-0026375
Feb. 7, 2014 (KR) .................. 10-2014-0013901

(51) Int. Cl.
*G02F 1/133*    (2006.01)
*G06F 1/16*    (2006.01)
*H05K 5/03*    (2006.01)
*H04M 1/02*    (2006.01)

(52) U.S. Cl.
CPC .......... *H05K 5/03* (2013.01); *G02F 1/13306* (2013.01); *G06F 1/1605* (2013.01); *G06F 1/1626* (2013.01); *G06F 1/1637* (2013.01); *H04M 1/0264* (2013.01); *H04M 1/0266* (2013.01); *Y10T 29/49002* (2015.01)

(58) Field of Classification Search
CPC .................................................. G02F 1/13306
See application file for complete search history.

(56) References Cited

U.S. PATENT DOCUMENTS

| | | |
|---|---|---|
| 2003/0161093 A1 | 8/2003 | Lam et al. |
| 2006/0077191 A1 | 4/2006 | Ming-Daw et al. |
| 2009/0039054 A1 | 2/2009 | Choi et al. |
| 2009/0257207 A1* | 10/2009 | Wang et al. .......... 361/752 |
| 2010/0142127 A1 | 6/2010 | Johansson |
| 2012/0020002 A1 | 1/2012 | Mathew et al. |
| 2012/0050975 A1 | 3/2012 | Garelli et al. |
| 2012/0105400 A1 | 5/2012 | Mathew et al. |

(Continued)

FOREIGN PATENT DOCUMENTS

| | | |
|---|---|---|
| CN | 101286445 A | 10/2008 |
| CN | 101666924 A * | 3/2010 |

(Continued)

OTHER PUBLICATIONS

Chinese Search Report dated Mar. 2, 2016.

(Continued)

*Primary Examiner* — Edmond Lau
(74) *Attorney, Agent, or Firm* — Cha & Reiter, LLC.

(57) ABSTRACT

An electronic device is provided comprising a display module comprising a display area and a peripheral area abutting on a side of the display area, wherein the display module comprises a glass layer extending across the display area and the peripheral area, and wherein the glass layer comprises a first recess positioned over the peripheral area.

19 Claims, 17 Drawing Sheets

(56) References Cited

U.S. PATENT DOCUMENTS

| | | |
|---|---|---|
| 2012/0195426 A1* | 8/2012 | White et al. .................. 380/210 |
| 2012/0199625 A1 | 8/2012 | Qi et al. |
| 2012/0231650 A1 | 9/2012 | Tian et al. |
| 2013/0016267 A1* | 1/2013 | Ko et al. .................. 348/333.01 |
| 2013/0176484 A1* | 7/2013 | Pilliod et al. ................ 348/373 |

FOREIGN PATENT DOCUMENTS

| | | |
|---|---|---|
| CN | 102246496 A | 11/2011 |
| CN | 102662302 A | 9/2012 |
| CN | 102883033 A | 1/2013 |

OTHER PUBLICATIONS

European Search Report, dated Oct. 5, 2016.
Chinese Search Report, dated Oct. 10, 2016.
Chinese Search Report dated Mar. 9, 2017.

\* cited by examiner

ELECTRONIC DEVICE HAVING DISPLAY MODULE

CLAIM OF PRIORITY

This application claims the benefit under 35 U.S.C. §119(a) of a Korean patent application filed in the Korean Intellectual Property Office on Mar. 12, 2013 and assigned Serial No. 10-2013-0026375 and a Korean patent application filed in the Korean Intellectual Property Office on Feb. 7, 2014 and assigned Serial No. 10-2014-0013901, the entire disclosures of which are hereby incorporated by reference.

BACKGROUND

1. Field

The present disclosure relates to an electronic device. More particularly, the present disclosure relates to an electronic device having a display module.

2. Description of the Related Art

Portable terminals may be used for multimedia playback, Internet access, gaming, and various other operations. Over the years, the primary function of portable terminals has shifted from conducting telephone calls to performing operations previously reserved for desktop and laptop computers. That shift has necessitated the use of fast processors and other high-capability hardware. The integration of this type of hardware, however, has caused the size of portable terminals to increase. This increase is in conflict with the general market preference for slim and lightweight devices. To address this conflict, a need exists for techniques for reducing the size of portable terminals without sacrificing performance.

SUMMARY

According to one aspect of the disclosure, an electronic device is provided comprising a display module comprising a display area and a peripheral area abutting on a side of the display area; wherein the display module comprises a glass layer extending across the display area and the peripheral area, and wherein the glass layer comprises a first recess positioned over the peripheral area.

According to another aspect of the disclosure, a method for manufacturing an electronic device is provided, the method comprising: providing a display module comprising a display area, a peripheral area abutting on a side of the display area, and a glass layer extending across the display area and the peripheral area, and forming a recess in the glass layer over the peripheral area.

According to yet another aspect of the disclosure, an electronic device is provided comprising: a display module having a display area and a peripheral area extending along an edge of the display area; a glass layer disposed on the display module, the glass layer having a recess positioned over the peripheral area; and an electronic device component disposed in the recess.

According to yet aspect of the disclosure, an electronic device is provided comprising: a display module comprising a display area, a peripheral area extending along a side of the display area, a Liquid Crystal Display (LCD) Driver Integrated Circuit (IC) (LDI) disposed in a first portion the peripheral area; a glass layer disposed on the display module, the glass layer having a recess positioned over a second portion of the peripheral area that borders the first portion; and an antenna radiation pattern disposed in the recess.

BRIEF DESCRIPTION OF THE DRAWINGS

The above and other aspects, features and advantages of certain examples of the present disclosure will be more apparent from the following description taken in conjunction with the accompanying drawings in which.

Throughout the drawings, like reference numerals will be understood to refer to like parts, components and structures.

DETAILED DESCRIPTION

The following description with reference to the accompanying drawings is provided to assist in a comprehensive understanding of the examples provided in the present disclosure. Various specific details are included in the disclosure to assist in that understanding, but these are to be regarded merely as examples. Accordingly, those of ordinary skill in the art will recognize that various changes and modifications of the examples described herein can be made without departing from the scope and spirit of the disclosure. Also, descriptions of well-known functions and constructions are omitted for clarity and conciseness.

The terms and words used in the following description and claims are not limited to the bibliographical meanings, but, are merely used to enable a clear and consistent understanding of the disclosure. Accordingly, it should be apparent to those skilled in the art that the following description is provided for illustrative purposes only and not for the purpose of limiting the disclosure as defined by the appended claims and their equivalents.

Although a mobile terminal having a display module is used as an example of an electronic device throughout the disclosure, the disclosure is not limited to mobile terminals only. For example, the present disclosure may be applicable to various electronic devices having a display module such as a Personal Digital Assistant (PDA), a laptop computer, a mobile phone, a smartphone, a netbook, a Mobile Internet Device (MID), an Ultra Mobile Personal Computer (UMPC), a tablet PC, a navigation device, an MP3 player, wearable electronic device, etc.

Also, in describing the embodiments of the present disclosure, a display module may be a general LCD module used as a data output means but is not limited thereto. For example, a touch sensor applied in a One Glass Solution (OGS) method and involving data input may be applied together.

Though a display module discloses and describes an Organic Light Emitting Diodes (OLED) in describing various embodiments of the present invention, it is not limited thereto. For example, the present invention may be applied to various display modules including a substrate formed of Low-Temperature Polycrystalline Silicon (LTPS). According to an embodiment, the display module may be applicable in an Active Matrix OLED (AMOLED).

According to various embodiments of the present invention, the display module may be a flexible display module formed in a film type.

In describing various embodiments of the present invention, the display module may be a concept including a touch sensor together. According to an embodiment, the display module may be contributed as a touchscreen including various display modules that use TFT substrate (Low Temperature Poly-Silicon (LTPS) substrate) such as an On-cell type OLED, an In-cell type OLED, etc., and a touch sensor that operates various methods, coupled thereto.

Figure 1:
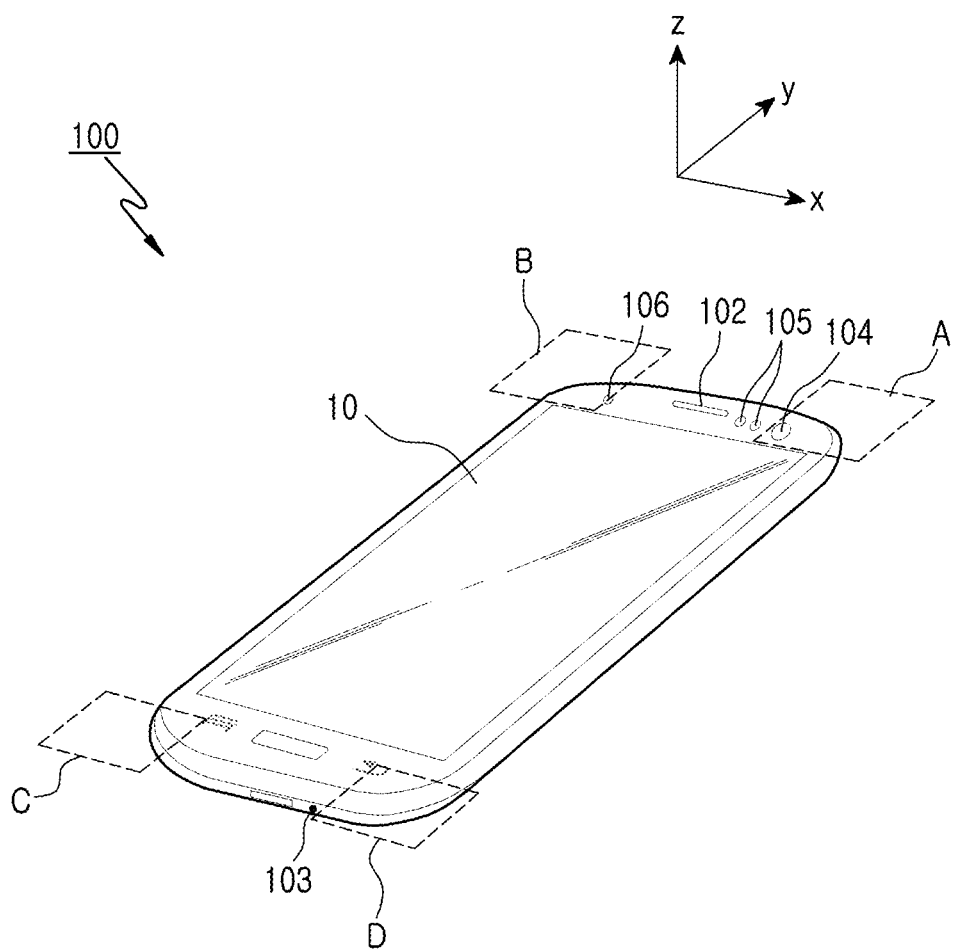
FIG. 1 is a perspective view of an electronic device having a recess or an opening in a display module of the electronic device according to aspects of the disclosure.

FIG. 1 is a perspective view of an electronic device 100 according to aspects of the disclosure. As illustrated, a display module 10 is installed on the front side of an electronic device 100, a speaker unit 102 for receiving a user's voice is installed in the upper portion of display module 10, and a microphone unit 103 is installed in the lower portion of the display module 10. In addition, a camera module 104, a sensor module 105, and a service LED 106 may be disposed near the speaker unit 102. In some implementations, the sensor module 105 may be an illumination sensor or a proximity sensor, and/or any other suitable type of sensor. The sensor module 105 may be used to variably operate the electronic device 100 according to the device's ambient conditions The at least one LED indicator 106 may be disposed on one side of the speaker unit 102 to allow a user to recognize various status information of the electronic device. Although it is not shown in FIG. 1, besides these components, various mechanical structures may also be mounted in/on the electronic device 100

Generally, the components installed in the electronic device 100 are disposed such that they do not overlap with the display module 10 in order to permit the display module 10 to be visible. Placing the components on the same plane as the display module 10, on the other hand, may reduce the thickness of the mobile terminal 10, but it may also cause an increase in the non-active area of the mobile terminal area (i.e., the so-called 'Black Mask (BM) region'). The non-active area may include portions (e.g., portions A, B, C, and D depicted in FIG. 1) of the surface of the terminal that are not occupied by portions of the display that produce image, such as visible display pixels. Having a non-active area, in some instances, may be undesirable because it results in a larger terminal size relative to the visible display space on the terminal.

According to aspects of the disclosure, portable terminal components may be placed in the same plane as the portable terminal's display unit without increasing the inactive area of the terminal as much as otherwise. Through the techniques discussed herein, the size of at least some of regions A, B, C, and D may be reduced thereby permitting the device 100 to have a smaller, and perhaps rounder, shape. This in turn can increase the device's elegance and aesthetic appeal.

Figure 2:
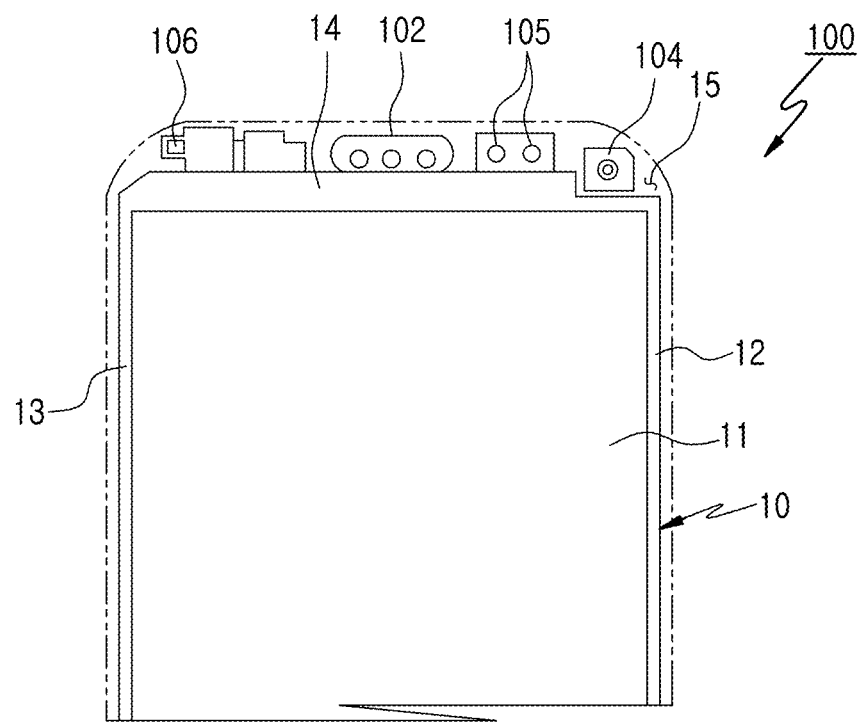
FIG. 2 is a diagram providing a partial view of the inner construction of the electronic device according to aspects of the disclosure.

FIG. 2 depicts a diagram of the device 100 according to aspects of the disclosure. As illustrated, the display module 10 occupies most of the area of the electronic device 100, and a speaker module 102, the sensor module 105, the camera module 104, and the LED indicator 106 are disposed above the display module 10. A recess 15 is formed in the display unit 10 as shown. In some implementations, the recess 15 may be (or include) an opening, a cavity, a cutting portion, or another similar structure. The camera module 104 may be disposed at least partially in the recess 15 of the display module 10. Placing the camera module 104 may reduce the size of the inactive area of the device 100. As noted above, reducing the inactive area of the device 100 may cause the device to be smaller, more rounded, and have a more elegant design.

The display module 10 may include a display area 11 and peripheral areas 12, 13, 14 formed to have a predetermined width along the periphery of the display area 11. The display area 11 may be one where images are output and when the terminal 100 is in operation, while the peripheral areas may be areas not used to produce images. Generally, manufactures are making an effort to make the width of the peripheral areas 12, 13, 14, small but an LDI region 141 of FIG. 3 including a gate drive integrated circuit (IC) and a data drive IC for driving the display module 10 should be indispensably included in one of the peripheral areas 12, 13, 14. In this example, the LDI region 141 is located in the peripheral area 14 and this causes peripheral area to be larger in size than peripheral areas 11, 12 and 13. This larger size makes it preferable to place the recess 15 in the peripheral area 14.

Figure 3:
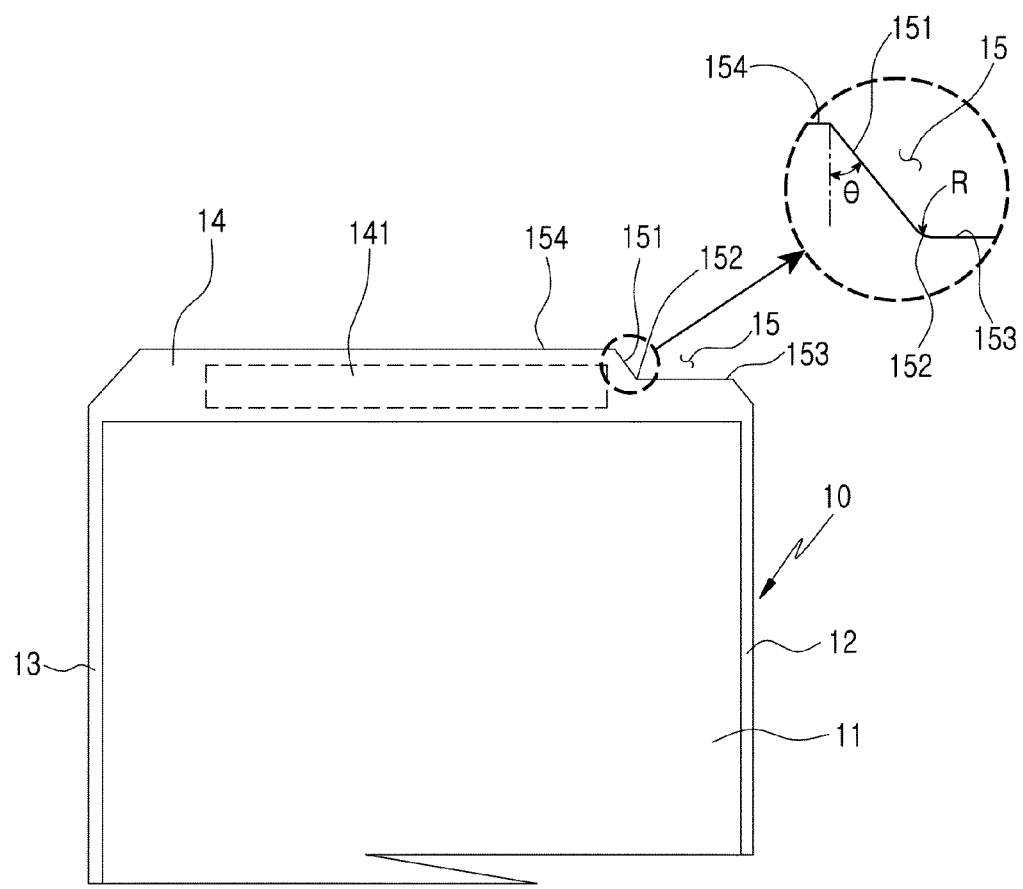
FIG. 3 is another diagram providing a partial view of the inner construction of the electronic device according to aspects of the disclosure.

FIG. 3 is a view partially illustrating a construction of a display module 10 of an electronic device 100 according to an embodiment of FIG. 1.

Referring to FIG. 3, the display module 10 includes the display area 11 and the peripheral areas 12, 13, 14 formed along the periphery of the display area 11. The peripheral areas 12, 13, 14 include the upper peripheral area 12, a lower peripheral area (not shown), the right peripheral area 12, and the left peripheral area 13. Also, since the upper peripheral area 14 includes in the LDI region 141, the upper peripheral area 14 is formed to have a wider width. Therefore, one or more recesses 15 according to an embodiment of the present invention may be formed in the upper peripheral area 14.

The recess 15 is cut as a sloped portion having a predetermined angle θ from a first horizontal portion 154 which is the outermost edge of the upper peripheral area 14, and then passes through an inflection portion and includes a second horizontal portion 153 formed in parallel with the first horizontal portion 154. However, the second horizontal portion 153 may be formed such that it is not in parallel with the first horizontal portion 154.

The above-described sloped portion 151 may be formed such that it is inclined in a direction from the first horizontal portion 154 to the second horizontal portion 153. An angle formed by the sloped portion 151 with respect to a direction perpendicular to the first horizontal portion 154 may be defined as a "slope angle θ". The slope angle has been defined with respect to the first horizontal portion in FIG. 3, but the slope angle may be defined with respect to the perpendicular direction of a direction in which the one side 111 of the display extends according to another embodiment.

The slope angle θ, for example, may be one of about 0, about 1, about 2, about 3, about 4, about 5, about 6, about 7, about 8, about 9, about 10, about 11, about 12, about 13, about 14, about 15, about 16, about 17, about 18, about 19, about 20, about 21, about 22, about 23, about 24, about 25, about 26, about 27, about 28, about 29, about 30, about 31, about 32, about 33, about 34, about 35, about 36, about 37, about 38, about 39, about 40, about 41, about 42, about 43, about 44, about 45, about 46, about 47, about 48, about 49, about 50, about 51, about 52, about 53, about 54, about 55, about 56, about 57, about 58, about 59, about 60, about 62, about 64, about 66, about 68, about 70, about 72, about 74, about 76, about 78, about 80, about 82, about 84, about 86, about 88 degree. According to an embodiment, for example, slope angle θ may be one of about 0, about 10, about 20, about 30, and about 45.

Also, the slope angle may be one number in the range where two arbitrary numbers among the above-listed numbers are a maximum value and a minimum value, respectively. According to an embodiment of the present invention, the slope angle θ may be formed to have a value in one range of 0° ~45°, 0° ~80°, 0°~70°, 0° ~60°, 0° ~50°, 0° ~40°, 0° ~30°, 0° ~20°, and 0° ~10° with respect to the perpendicular direction. Also, the inflection portion 152 where the sloped portion 151 and the second horizontal portion 153 meet may be formed in a bent curved shape and the curvature radius R may be 0.3. However, the curvature radius R may be changed to have an optimal curvature radius depending on the slope angle of the sloped portion 151. For example, this curvature radius may be one of about 0.1, about 0.2, about 0.3, about 0.4, about 0.5, about 0.6, about 0.7, about 0.8, about 0.9, and about 1. According to an embodiment, the curvature radius R may be one number in the range where two arbitrary numbers among the above-listed numbers are a maximum value and a minimum value, respectively.

Figure 4:
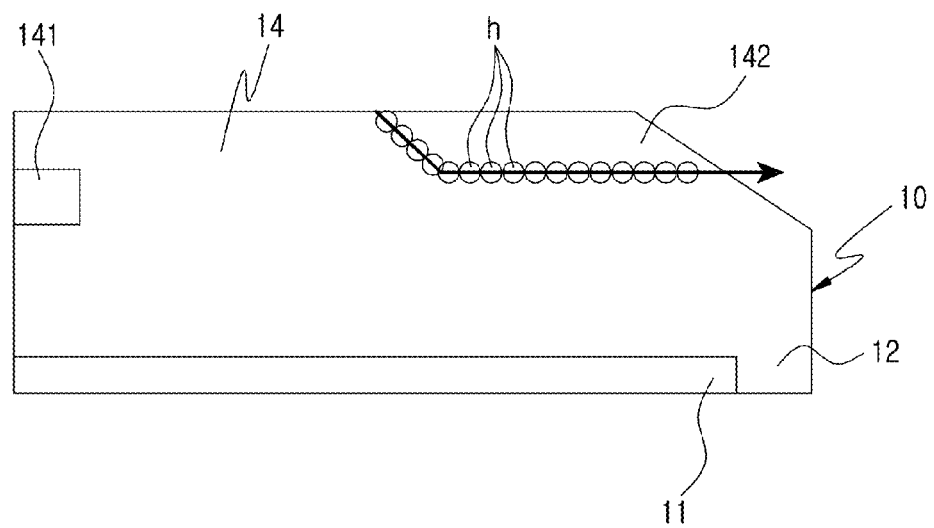
FIG. 4 is a diagram illustrating a process for forming a recess in a display module of the electronic device according to aspects of the disclosure.

FIG. 4 depicts an example of a process for forming the recess 15 in the display module 10 according to aspects of the disclosure. The display module 10 according to an embodiment of the present disclosure is formed using a plurality of glass layers. The glass layers may include an upper glass substrate and a lower glass substrate that are stacked together. The lower glass substrate may be formed of a Low-Temperature Polycrystalline Silicon (LTPS).

In one example, the recess 15 is formed by drilling a plurality of holes h in the display module 10 along the shape of the recess 15. When the holes h are formed, a cut piece 142 may be easily separated from the glass layer of the display module 10 by using a small amount of force. The holes h can be formed by using a laser drilling machine and/or any other suitable type of drill (e.g., a drill that uses solid bits). According to an embodiment, the recess 15 of the display module 10 formed by the cut piece 142 may be formed on only a lower glass substrate relatively formed wider than an upper glass substrate. According to an embodiment, the recess 15 of the display module 10 formed by the cut piece 142 may be provided on both the upper glass substrate and the lower glass substrate formed in the same or a similar size.

Figure 5:
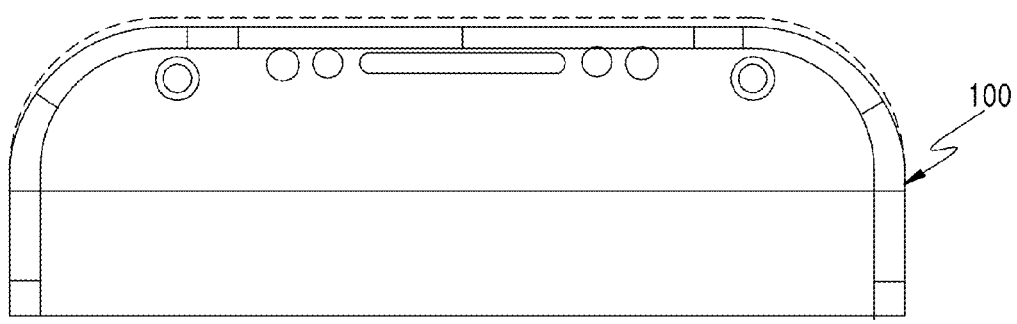
FIG. 5 is a diagram illustrating a reduction of size of the electronic device that can be achieved in accordance with aspects of the disclosure.

FIG. 5 illustrates an example of reductions in the footprint of electronic device 100 that can be realized through the use of recess 15. In this example, the region marked by a dashed line represents the size the electronic device 100 would have had if the recess 15 were not utilized. As illustrated, the footprint of the device 100 can be successfully reduced when the recess 15 is formed in the display unit 100 and the camera 104 is placed in the recess.

Figure 6A:
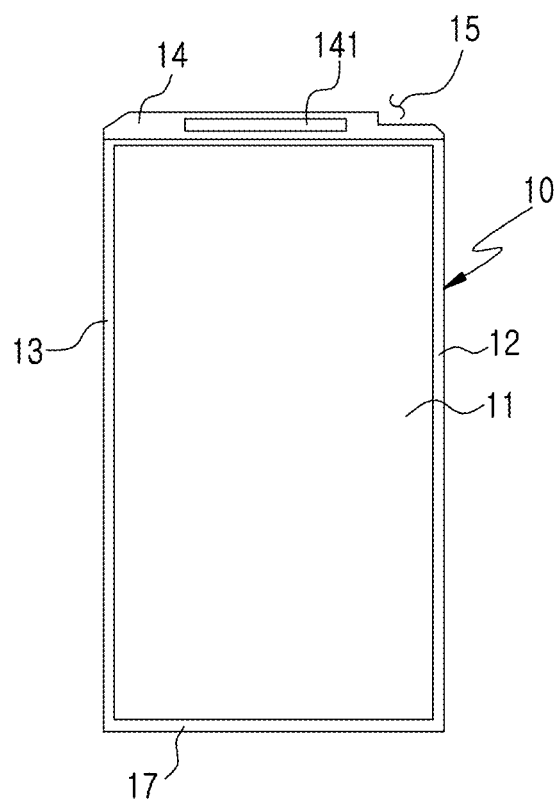
FIG. 6A, FIG. 6B, FIG. 6C, FIG. 7A, FIG. 7B and FIG. 7C are diagrams illustrating a display module according to aspects of the disclosure.

FIGS. 6A to 7C-C provide examples of different configurations of the display unit 10 according to aspects of the disclosure. FIG. 6A illustrates a configuration where the recess 15 is formed in the right portion of the upper peripheral area 14, FIG. 6B illustrates a state where a recess 16 is formed in the left portion of the upper peripheral area 14, and FIG. 6C illustrates a configuration where recesses 15 and 16 are formed together in the left and right portions of the upper peripheral area 14, respectively. The locations in the display unit 10 where recesses 15 and 16 are formed may be determined based on desired positions of components of the electronic device 100.

Figure 7A:
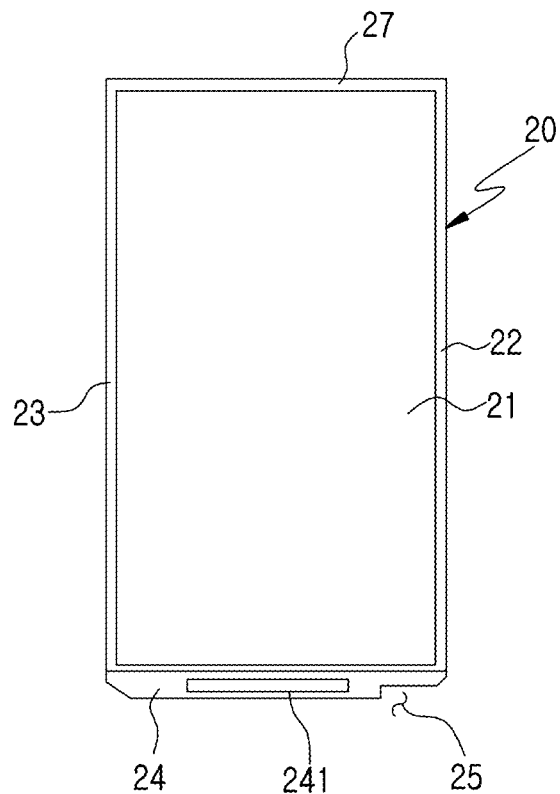
Figure 7B:
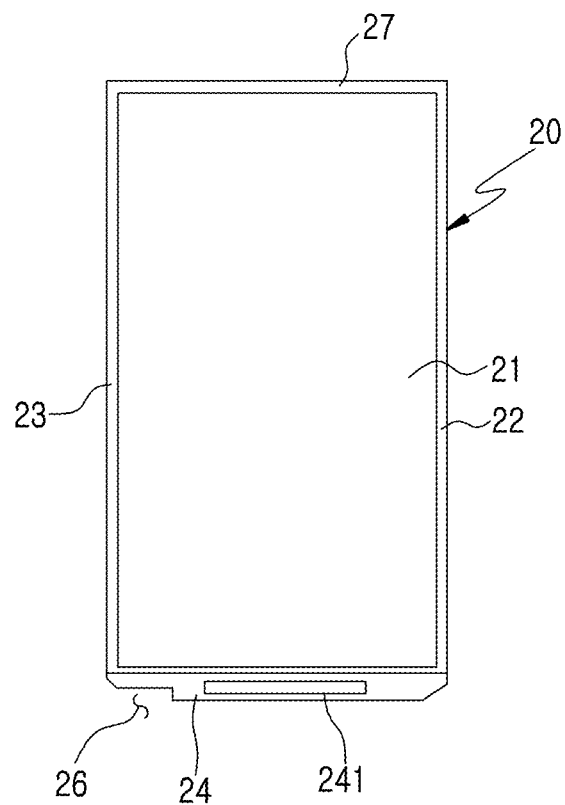
Figure 7C:
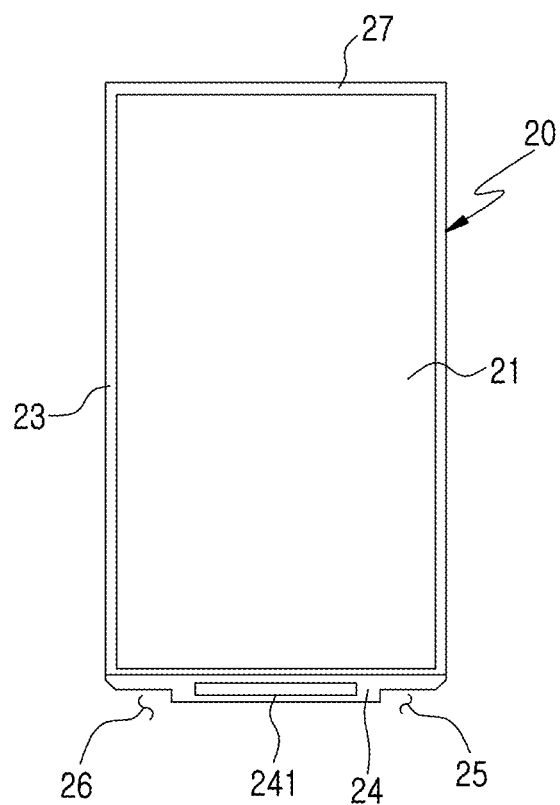

Also, FIGS. 7A to 7C-C depict examples of different configurations of a display module 20 according to aspects of the disclosure. As illustrated, the display module 20 includes peripheral areas 22, 23, 24, 27, and an LDI region 241 that is located in the peripheral area 24. More specifically, FIG. 7A illustrates a configuration where the recess 25 is formed in the right portion of the lower peripheral area 24. FIG. 7B illustrates a configuration where a recess 26 is formed in the left portion of the lower peripheral area 24. And FIG. 7C illustrates a state where recesses 25 and 26 are formed together, in the right and the left portions, respectively, of the lower peripheral area 24.

Figure 6B:
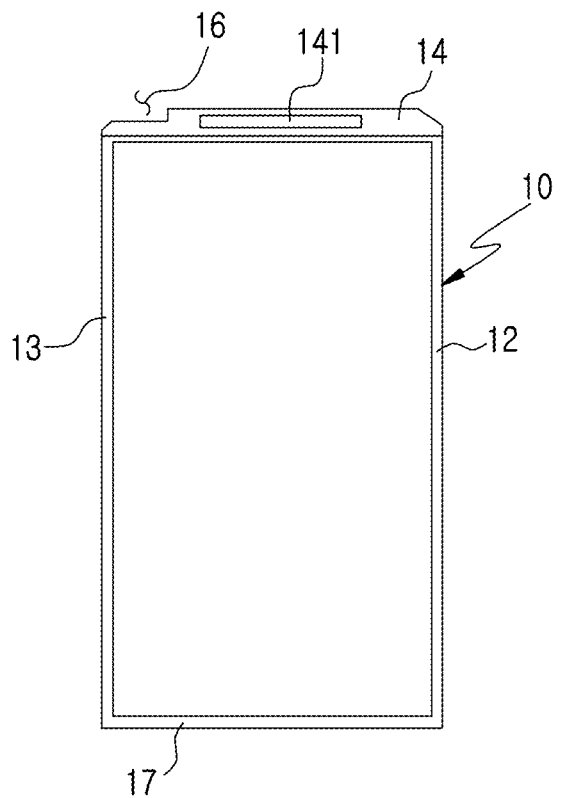
Figure 6C:
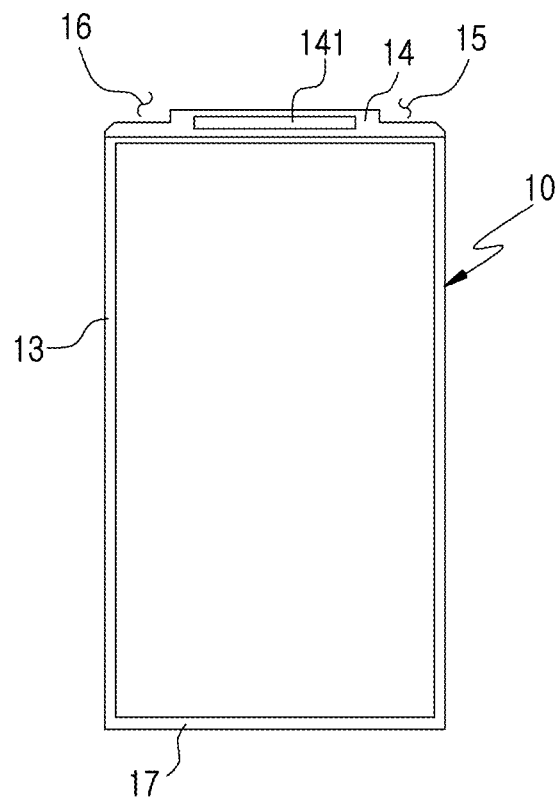

It should be noted that features of the display unit configurations presented with respect to FIGS. 6A-C and 7A-C may be further combined to arrive at additional display unit configurations. In that regard, any number of the recesses 15, 16, 25, 26 may be formed in one or more peripheral areas of a given display module. For example, the recess may be 15 formed in the right portion of an upper peripheral area of a display unit, and the recesses 25 and 26 may be formed in the lower peripheral area of the display unit. As another example, the recess 16 may be formed in the left portion of the upper peripheral area of a display unit and the recesses 25 and 26 may be formed in the lower peripheral area of the same display unit. As yet another example, the recesses 15 and 16 may be formed in the right and the left portions, respectively, of the upper peripheral area of a display unit and the recesses 25 and 26 may be formed in the lower peripheral area of the same display unit as illustrated in FIGS. 7A to 7C. As yet another example, the recess 25 may be formed in the right portion of the lower peripheral area of a display unit and the recesses 15 and 16 may be formed in the upper peripheral area of the same display unit. As yet another example, the recess 26 may be formed in the left portion of the lower peripheral area of a display unit and the recesses 15 and 16 may be formed in the upper peripheral area of the same display unit, as illustrated in FIGS. 6A to 6C. As yet another example, the recesses 25 and 26 may be formed in the right and left portions, respectively, of the lower peripheral area of a display unit and the recesses 15 and 16 may be formed in the upper peripheral area 14 of the same display unit.

Figure 8:
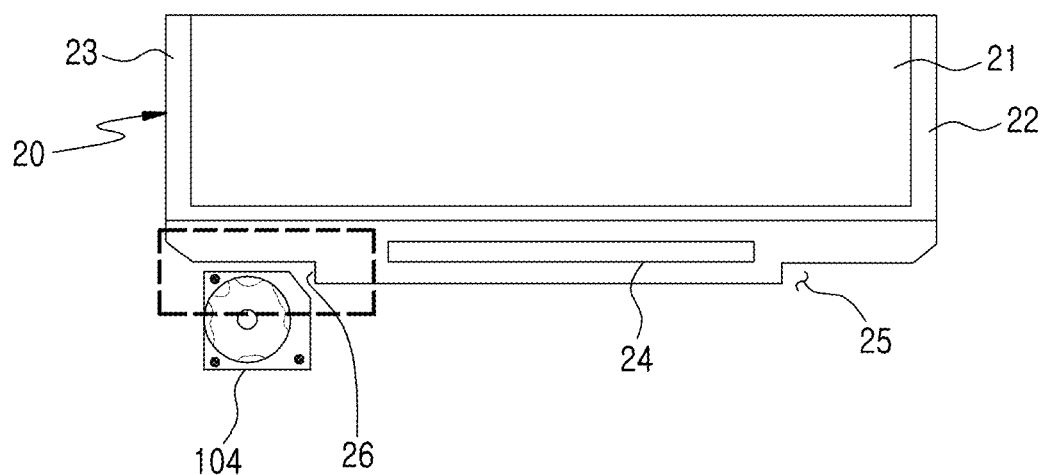
FIG. 8 and FIG. 9 are diagrams illustrating the embedding of various electronic device components into a display module recess according to aspects of the disclosure.
Figure 9:
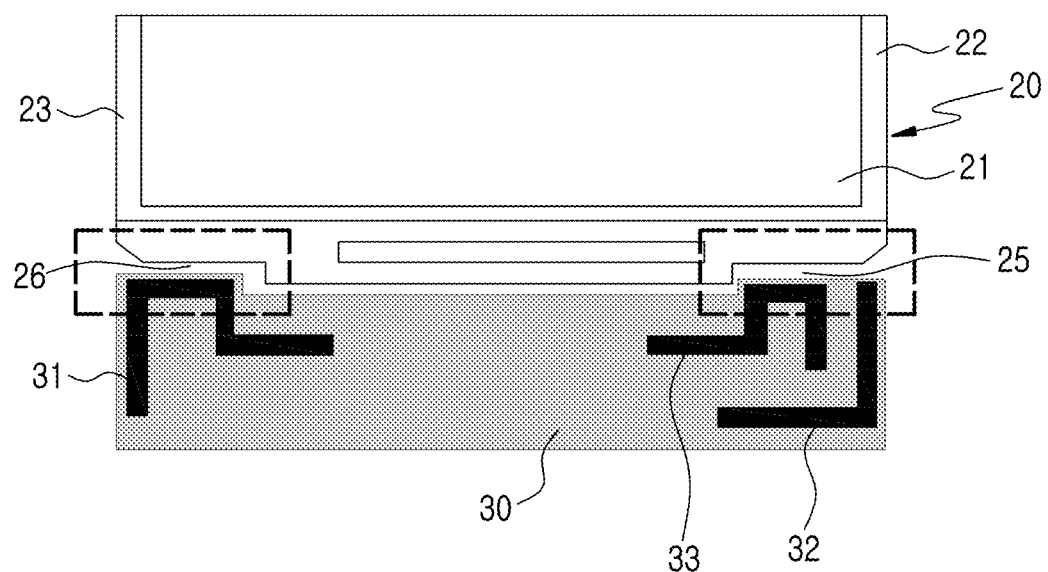

FIGS. 8 and 9 are schematic diagrams depicting further aspects of the integration of display module 20 into an electronic device, according to aspects of the disclosure. Referring to FIG. 8, the camera module 104 is disposed in the recess 26 formed in the left portion 17 of the lower peripheral area 24. Because a portion of the camera module 104 is disposed in such a way that it is seated in the recess 26, the entire size of the electronic device may be reduced by a depth at which the camera module 104 is seated in the recess 26. Referring to FIG. 9, an antenna module 30 is disposed in the recesses 25 and 26. The antenna module may include a substrate having radiation patterns 31, 32, 33 and a carrier (not shown). In some implementations, one or more of the radiation patterns 31, 32, and 33 may be disposed in the recesses 25 and 26, so that utilization of the radiation patterns may be increased. Although in the above examples, a camera and antenna module are at least partially disposed in the recesses 25 and 26, in other examples any suitable type of electronic device component may be disposed in the recesses.

Figure 10:
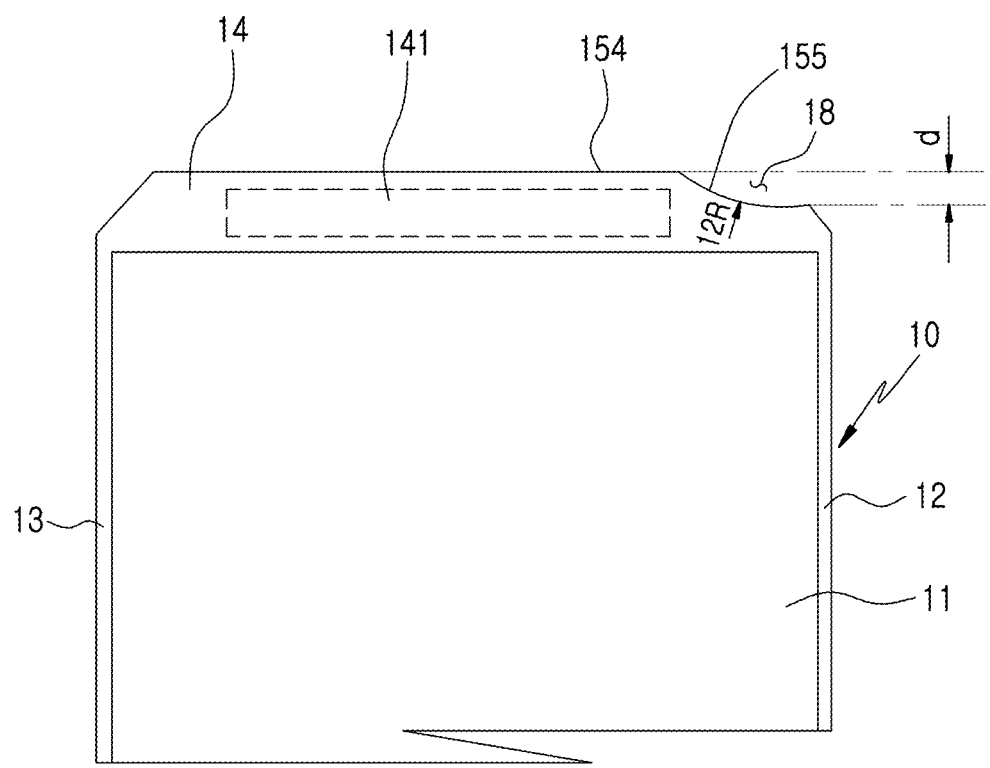
FIG. 10 is a diagram providing a partial view of a display module according to aspects of the disclosure.

FIG. 10 depicts an example of a configuration of the display unit 10 in accordance with yet another aspect of the disclosure. In this example, the display module 10 includes a display area 11 and peripheral areas 12, 13, 14 formed along the edge of the display area 11. The peripheral areas include an upper peripheral area 14, a lower peripheral area (not shown), a right peripheral area 12, and a left peripheral area 13. Because the upper peripheral area 14 includes an LDI region 141, it has a greater width than the rest of the peripheral areas 12 and 13. Accordingly, one or more recesses 18 may be formed in the upper peripheral area 14.

As illustrated, the recess 18 may include a sloped portion 155 formed at a predetermined curvature R. In one example, the curvature radius R of the sloped portion 155 may be 12. However, in other examples, the sloped portion 155 may have any suitable curvature radius depending on the size of an LDI region, the entire size of the display module, and the kind and the shape of peripherals that are at least partially disposed in the recess 15'. In some implementations, the sloped portion 155 may be formed such that it is bent tin the direction of the display area 11. In some implementations, the depth d of the sloped portion 155 11 may be 1.1 mm. In other implementations, however, the sloped portion 155 may have a different depth depending on the size of an LDI region, the size of the display module, and/or the kind and the shape of components disposed in the recess 15'.

Figure 11A:
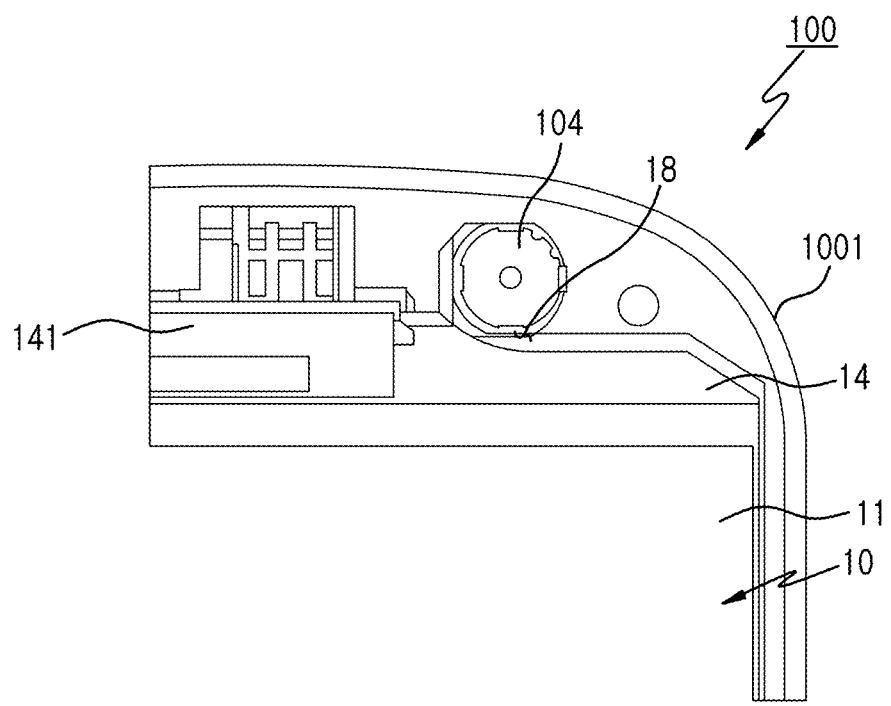
FIG. 11A and FIG. 11B are a partial plan view and a perspective view of an electronic device, illustrating a state where a camera module has been mounted on a recess of a display module according to an embodiment of the present invention.
Figure 11B:
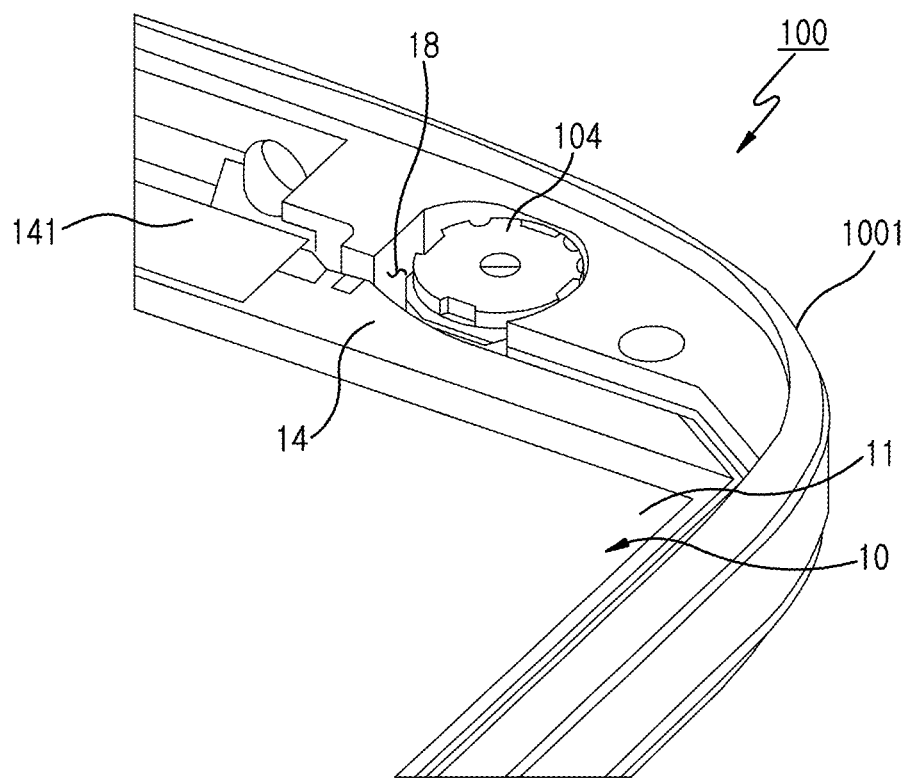

FIGS. 11A and 11B are a partial plan view and a perspective view of an electronic device, illustrating a state where a camera module has been mounted on a recess of a display module according to an embodiment of the present invention.

Referring to FIGS. 11A and 11B, at least a portion of a camera module 104 may be installed in such a way that a portion of the display module 10 is received in the recess 18 formed in a curved shape as illustrated in FIG. 10.

According to an embodiment, the position of the camera module 104 may be supported by a first case frame 1001 of the electronic device 100. According to an embodiment, the camera module 104 may be installed in such a way that it is safely seated in the recess 18 formed in the curved shape in the right side of the LDI region 141 of the upper region 14 of the display module 10.

Hereinafter, an installation of the display module 10 and the camera module 104 is described in more detail.

Figure 12:
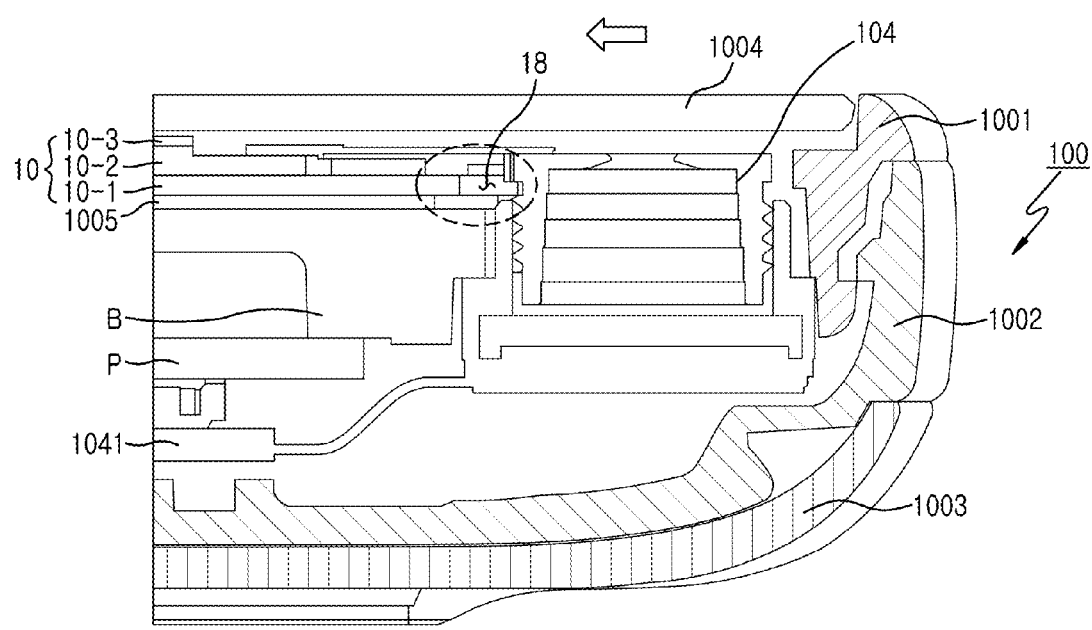
FIG. 12 is a crucial cross-sectional view of an electronic device, illustrating a state where a camera module has been mounted on a recess of a display module according to an embodiment of the present invention.

FIG. 12 is a crucial cross-sectional view of an electronic device, illustrating a state where a camera module has been mounted on a recess of a display module according to an embodiment of the present invention.

Referring to FIG. 12, the electronic device 100 is coupled to a first case frame 1001 and a second case frame 1002, and the display module 10 may be received in a space formed by coupling of the first case frame 1001 and the second case frame 1002. According to an embodiment, the first case frame 1001 may contribute as the front case frame of the electronic device 100, and the second case frame 1002 may contribute as the rear case frame of the electronic device 100. According to an embodiment, a battery cover 1003 may be further installed to the second case frame 1002.

According to an embodiment, the camera module 104 may be fixed by a first case frame 1001 and a rigidity reinforcement bracket B. According to an embodiment, the display module 10 may be attached to one side of the bracket B by a double sided tape 1005. According to an embodiment, after the display module 10 is fixed to the bracket B, a window 1004 may be further installed to the upper portion thereof. According to an embodiment, the window 1004 may be fixed to the first case frame 1001. According to an embodiment, the window 1004 may be formed of glass or a film.

According to an embodiment, the display module 10 may include a first substrate 10-1 and a second substrate 10-2 stacked on the upper portion of the first substrate 10-1. According to an embodiment, both the first and second substrates 10-1 and 10-2 may be formed of glass. However, it is not limited thereto, and may be formed of various materials forming other display modules.

According to an embodiment, in the case where the display module 10 is applied in an OLED type, the first substrate 10-1 may be a TFT glass substrate, and the second substrate 10-2 may be a cover glass of a polarizing function. According to an embodiment, an organic material may fill between the first substrate 10-1 and the second substrate 10-2 so that it is interrupted by a cell seal formed of a glass frit composite.

According to an embodiment, a touch sensor 10-3 may be further disposed on the upper portion of the second substrate 10-2 by an Optical Clear Adhesive (OCA) (not shown). However, it is not limited thereto, and the touch sensor 10-3 may be disposed on the lower portion of the first substrate 10-1, and disposed on the backside of the window 1004. According to an embodiment, the touch sensor 10-3 may be formed in such a way that electrodes (x, y electrodes) are deposited on the position of at least one of the window 1004 and the first and second substrates 10-1 and 10-2.

According to an embodiment of the present invention, the first substrate 10-1 may include the recess 18 (the dotted portion of FIG. 12). By the recess 18 of the first substrate 10-1, the camera module 104 disposed inside the electronic device 100 may be moved and disposed further to the shown arrow direction. According to an embodiment, a connector 1041 of the installed camera module 104 may be electrically connected to a substrate P installed on one side of the bracket B. According to an embodiment, when the first substrate 10-1 and the second substrate 10-2 are configured in the same size or a similar size, the recess 18 may be formed in the two substrates, simultaneously.

According to various embodiments of the present invention, though the display module 10 discloses and describes an Organic Light Emitting Diodes (OLED), it is not limited thereto. For example, the embodiments may be applied to various display modules including a substrate formed of Low-Temperature Polycrystalline Silicon (LTPS). According to an embodiment, various embodiments of the present invention may be applied to Active Matrix OLED (AMOLED) or Passive Matrix OLED (PMOLED) display modules. According to an embodiment, the display module may be an On Cell TSP AMOLED (OCTA).

Although the disclosure has been shown and described with reference to specific examples, it will be understood by those skilled in the art that various changes in form and details may be made therein without departing from the spirit and scope of the disclosure as defined by the appended claims and their equivalents. Therefore, the scope of the present disclosure should not be limited to the above-described examples.

What is claimed is:

1. An electronic device comprising:
a display module comprising a display area, a first peripheral area abutting on a side of the display area, and a second peripheral area formed in perpendicular to the first peripheral area, the first peripheral area including a Liquid Crystal Display (LCD) Driver Integrated Circuit (IC) (LDI) region of the display module;
wherein the display module comprises a glass layer having an upper glass substrate and a lower glass substrate stacked together and extending across the display area, the first peripheral area, and the second peripheral area; and
wherein the glass layer comprises a first recess positioned over the first peripheral area, and
wherein a surface of the glass layer forming the first recess includes:
a first planar cutting portion formed in a portion of an outermost edge of the first peripheral area toward the display area with a first inclination;
a second planar cutting portion extended from an ending point of the first cutting portion and formed in parallel with the outermost edge of the first peripheral area;
an inflection portion disposed between the first planar cutting portion and the planar second cutting portion, wherein the inflection portion is formed in a bent curved shape having predetermined radius R;
a third planar cutting portion extended from an ending point of the second planar cutting portion to the second peripheral area with a second inclination; and
a component having a perimeter arranged entirely within the first recess in a non-active portion of the first peripheral area, wherein the component is located in a same plane as the display module.

2. The electronic device of claim 1, wherein the component comprises one or more of a camera module, a sensor module, an antenna module, and a mechanical structure.

3. The electronic device of claim 1, wherein the lower glass substrate comprises a Low-Temperature Polycrystalline Silicon (LTPS), and wherein the first recess is constructed only on the lower glass substrate that overlaps further with the first peripheral area than the upper glass substrate.

4. The electronic device of claim 1, wherein the electronic device is a communications terminal having a short side and a long side, and the first peripheral area abuts on the short side.

5. The electronic device of claim 4, wherein the first recess is positioned in a corner of the glass layer.

6. The electronic device of claim 1, wherein the component is a camera module having a lens facing in a same general direction as the display module.

7. The electronic device of claim 1, wherein the display module comprises another peripheral area abutting on another side of the display area, the glass layer further extends across the another peripheral area, and the glass layer comprises a second recess positioned over the another peripheral area.

8. A method for manufacturing an electronic device, the method comprising:
providing a display module comprising a display area, a first peripheral area abutting on a side of the display area and a second peripheral area formed in perpendicular to the first peripheral area, and a glass layer having an upper glass substrate and a lower glass substrate stacked together and extending across the display area, the first peripheral area, and the second peripheral area;
forming a recess in the glass layer over the first peripheral area, and wherein a surface of the glass layer forming the recess includes:
a first planar cutting portion formed in a portion of an outermost edge of the first peripheral area toward the display area with a first inclination;
a second planar cutting portion extended from an ending point of the first cutting portion and formed in parallel with the outermost edge of the first peripheral area;
an inflection portion disposed between the first planar cutting portion and the second planar cutting portion, wherein the inflection portion is formed in a bent curved shape having predetermined radius R, and
a third planar cutting portion extended from an ending point of the second planar cutting portion to the second peripheral area with a second inclination; and
positioning a component having a perimeter entirely within the recess in a non-active portion of the first peripheral area, wherein the component is located in a same plane as the display module.

9. The method of claim 8, wherein forming the recess comprises cutting a portion of the glass layer, the portion being located over the first peripheral area and the recess is constructed only on the lower glass substrate that overlaps further with the first peripheral area than the upper glass substrate.

10. The method of claim 9, wherein the portion of the glass layer is cut using a laser.

11. An electronic device comprising:
a display module having a display area, a first peripheral area extending along an edge of the display area, and a second peripheral area formed in perpendicular to the first peripheral area, the first peripheral area including a Liquid Crystal Display (LCD) Driver Integrated Circuit (IC) (LDI) region of the display module;
a glass layer disposed on the display module, the glass layer having an upper glass substrate and a lower glass substrate stacked together and having a recess positioned over the first peripheral area; and
an electronic device component having a perimeter disposed entirely within the recess in a non-active portion of the first peripheral area, so that the electronic device component is located in a same plane as the display module, and wherein a surface of the glass layer forming the recess includes:
a first planar cutting portion formed in a portion of an outermost edge of the peripheral area toward the display area with a first inclination;
a second planar cutting portion extended from an ending point of the first cutting portion and formed in parallel with the outermost edge of the first peripheral area;
an inflection portion disposed between the first planar cutting portion and the second planar cutting portion, wherein the inflection portion is formed in a bent curved shape having predetermined radius R; and
a third planar cutting portion extended from an ending point of the second planar cutting portion to the second peripheral area with a second inclination.

12. The electronic device of claim 11, wherein the recess is formed by cutting a portion of the glass layer.

13. The electronic device of claim 11, wherein the electronic device component comprises one or more of a camera module, a sensor module, and an antenna module.

14. The electronic device of claim 11, wherein the lower glass substrate comprises a Low-Temperature Polycrystalline Silicon (LTPS), and wherein the recess is constructed only on the lower glass substrate overlaps further with the first peripheral area than the upper glass substrate.

15. The electronic device of claim 11, wherein the recess includes a sloped edge.

16. The electronic device of claim 15, wherein the sloped edge is inclined at an angle in a range of 0~80 degrees, relative to a line that is orthogonal to the edge of the display area.

17. The electronic device of claim 15, wherein the sloped edge is inclined at an angle in a range of 0~45 degrees, relative to a line that is orthogonal to the edge of the display area.

18. The electronic device of claim 11, wherein the recess includes an edge having a curved shape that is bent towards an interior of the display module.

19. An electronic device comprising:
a display module comprising a display area, a first peripheral area extending along a side of the display area, and a second peripheral area formed in perpendicular to the first peripheral area, a Liquid Crystal Display (LCD) Driver Integrated Circuit (IC) (LDI) disposed in a first portion the first peripheral area;
a glass layer disposed on the display module, the glass layer having an upper glass substrate and a lower glass substrate stacked together and having a recess positioned over a second portion of the first peripheral area including a Liquid Crystal Display (LCD) Driver Integrated Circuit (IC) (LDI) region that borders the first portion; and
an antenna radiation pattern having a perimeter disposed entirely within the recess wherein the antenna is located in a same plane as the display module,
wherein a surface of the glass layer forming the recess includes:
a first planar cutting portion formed in a portion of an outermost edge of the first peripheral area toward the display area with a first inclination;
a second planar cutting portion extended from an ending point of the first cutting portion and formed in parallel with the outermost edge of the first peripheral area;
an inflection portion disposed between the first planar cutting portion and the second planar cutting portion, wherein the inflection portion is formed in a bent curved shape having predetermined radius R; and
a third planar cutting portion extended from an ending point of the second planar cutting portion to the second peripheral area with a second inclination,
wherein the recess is constructed only on the lower glass substrate overlaps further with the first peripheral area than the upper glass substrate.

* * * * *